US011749496B2

United States Patent
Brundage (10) Patent No.: US 11,749,496 B2
(45) Date of Patent: Sep. 5, 2023

(54) PROTECTIVE SHUTTER FOR CHARGED PARTICLE MICROSCOPE

(71) Applicant: FEI Company, Hillsboro, OR (US)

(72) Inventor: Philip Brundage, Portland, OR (US)

(73) Assignee: FEI Company, Hillsboro, OR (US)

( * ) Notice: Subject to any disclaimer, the term of this patent is extended or adjusted under 35 U.S.C. 154(b) by 54 days.

(21) Appl. No.: 17/353,317

(22) Filed: Jun. 21, 2021

(65) Prior Publication Data

US 2022/0406562 A1    Dec. 22, 2022

(51) Int. Cl.
*H01J 37/28* (2006.01)
*H01J 37/26* (2006.01)
*H01J 37/32* (2006.01)
*H01J 37/34* (2006.01)

(52) U.S. Cl.
CPC ............ *H01J 37/28* (2013.01); *H01J 37/265* (2013.01); *H01J 37/3244* (2013.01); *H01J 37/3447* (2013.01); *H01J 2237/31749* (2013.01)

(58) Field of Classification Search
CPC .. H01J 37/00; H01J 37/02; H01J 37/26; H01J 37/28; H01J 37/265; H01J 37/3244; H01J 37/3447; H01J 2237/31749
USPC .......................................... 250/306, 307, 311
See application file for complete search history.

(56) References Cited

U.S. PATENT DOCUMENTS

| | | | |
|---|---|---|---|
| 2009/0212239 A1* | 8/2009 | Maruo ................. | H01J 37/3056 250/492.3 |
| 2018/0218878 A1* | 8/2018 | Xu .......................... | H01J 37/28 |
| 2019/0157037 A1* | 5/2019 | Tomimatsu ............. | H01J 37/28 |
| 2021/0066045 A1* | 3/2021 | Koike ...................... | H01J 37/02 |

* cited by examiner

*Primary Examiner* — Jason L McCormack (57) ABSTRACT

Disclosed herein are techniques directed toward a protective shutter for a charged particle microscope. An example apparatus at least includes a charged particle column and a focused ion beam (FIB) column, a gas injection nozzle coupled to a translation device, the translation device configured to insert the gas injection nozzle in close proximity to a stage, and a shutter coupled to the gas injection nozzle and arranged to be disposed between the sample and the SEM column when the gas injection nozzle is inserted in close proximity to the stage.

12 Claims, 6 Drawing Sheets

PROTECTIVE SHUTTER FOR CHARGED PARTICLE MICROSCOPE

FIELD OF THE INVENTION

The invention relates generally to charged particle microscopes, and specifically to charged particle microscopes that include a protective shutter for using during ion processing.

BACKGROUND OF THE INVENTION

Various forms of charged particle microscopes include focused ion beams that are used for sample processing. The processing can include sputtering of sample material, gas-assisted etching of the sample, and/or gas-based material deposition on the sample. During any of those processes, there is the potential to redeposit material on undesired areas or cause deposition on those undesired areas due to interaction of charged particles and gas vapors. Such redeposition or deposition can cause degradation if it is on sensitive components, such as detectors and lens electrodes. While other protection means have been around, such protection means have other drawbacks, such as access port consumption, and better, more useful protection is desired.

SUMMARY

Disclosed herein are techniques directed toward a protective shutter for a charged particle microscope. An example apparatus at least includes a charged particle column and a focused ion beam (FIB) column, a gas injection nozzle coupled to a translation device, the translation device configured to insert the gas injection nozzle in close proximity to a stage, and a shutter coupled to the gas injection nozzle and arranged to be disposed between the sample and the SEM column when the gas injection nozzle is inserted in close proximity to the stage.

BRIEF DESCRIPTION OF THE DRAWINGS

Like reference numerals refer to corresponding parts throughout the several views of the drawings.

DETAILED DESCRIPTION OF EMBODIMENTS

Embodiments of the present invention are described below in the context of a charged particle microscope including a protective shutter coupled to a gas injection nozzle. The protective gas injection nozzle may be inserted toward a sample so that the protective shutter is arranged between the sample and sensitive components of a charged particle column, such as lens electrodes, pole pieces, and detector surfaces. It should be understood that the methods described herein are generally applicable to a wide range of different tomographic methods and apparatus, including both cone-beam and parallel beam systems, and are not limited to any particular apparatus type, beam type, object type, length scale, or scanning trajectory As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatuses are referred to as "lowest", "best", "minimum," or the like. It will be appreciated that such descriptions are intended to indicate that a selection among many used functional alternatives can be made, and such selections need not be better, smaller, or otherwise preferable to other selections.

Current dual beam systems can incur failures due to gas processing affecting SEM column components and/or detectors. For example, while using a FIB column to deposit or remove material from a sample, sputtered and reactive component from the sample can re-deposit on the SEM column and/or detectors in the chamber. This re-deposition may degrade collection efficiencies of detectors, and the re-deposition on the SEM column components may charge up due to secondary/backscatter electrons, which can generate non-uniform fields in and around the end of the column, which can also affect detector performance. Existing mitigation schemes may use a shutter to cover the SEM column during FIB-based processing. However, such shutters occupy chamber ports that could be used for additional processing and/or analytical purposes. Such shutters may also affect FIB performance or be inserted simultaneously with gas injection systems (GIS) for FIB processing. As such, a solution to protect the SEM column components while providing effective FIB processing is desired. It should be noted that such a solution could be included in transmission electron microscopes that incorporate a FIB column so that objective lens components could be protected while FIB processing a sample.

One solution is to attach a shutter to a GIS nozzle that can protect the SEM column components while allowing for effective FIB processing to occur. Such a shutter could extend beyond the GIS nozzle to be arranged between the processing location and the SEM column pole piece. To ensure the shutter is aligned to the SEM column, alignment marks can formed on a SEM-facing side of the shutter for aligning the shutter in X, Y, Z directions. Additionally, and depending on shutter shape, images of the shutter may be used to determine the roll of the shutter and correct any related alignment issues.

Figure 1:
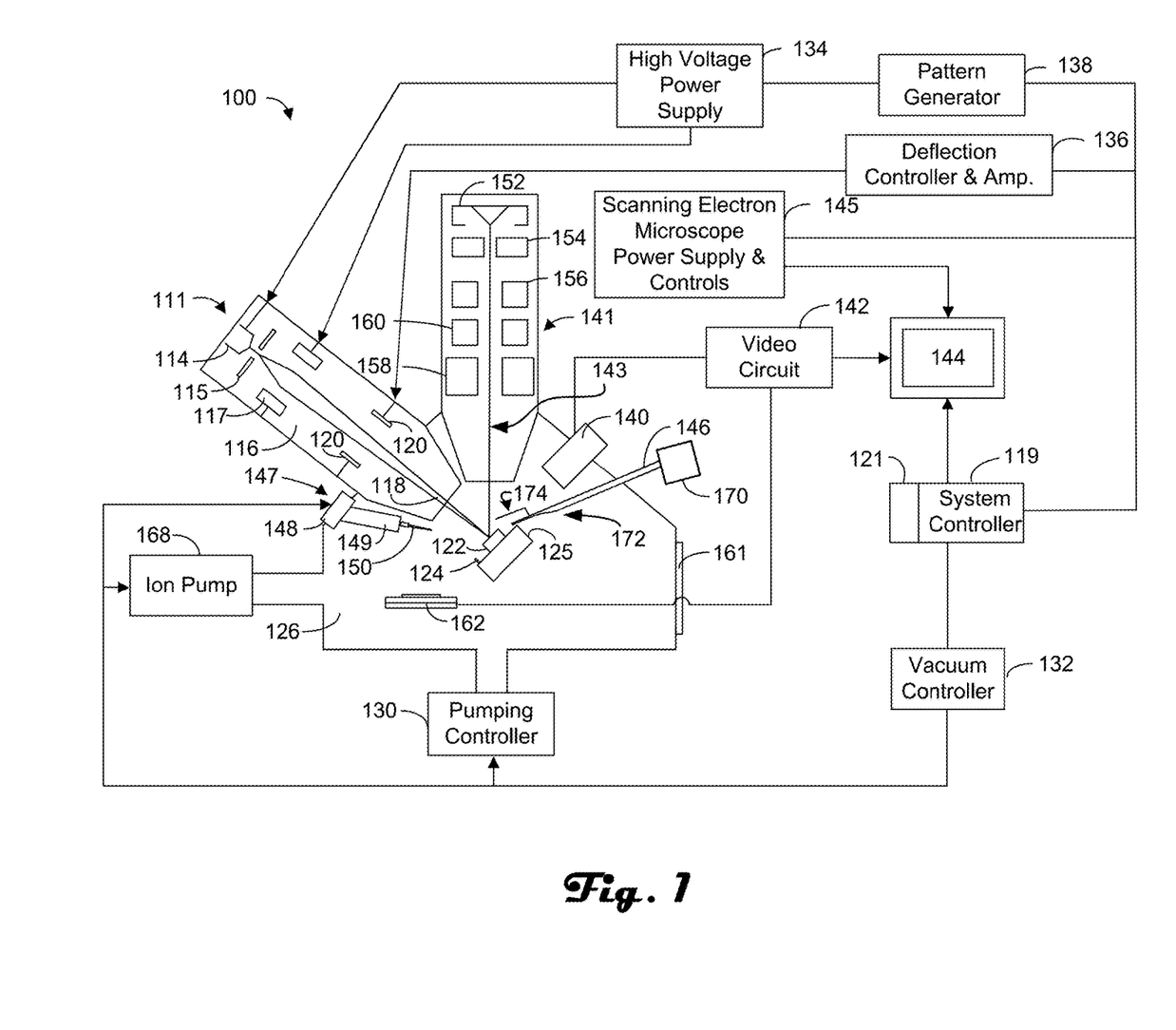
FIG. 1 is an example microscope with a shutter incorporated into a gas injection nozzle in accordance with an embodiment of the present disclosure.

FIG. 1 is an example microscope 100 with a shutter incorporated into a gas injection nozzle in accordance with an embodiment of the present disclosure. Microscope 100 is an example dual beam system 100, but the disclosed techniques could be implemented with any charged particle microscope that needs to protect sensitive components from contamination during ion beam processing of a sample. Example microscope 100 includes a vertically mounted SEM column and a focused ion beam (FIB) column mounted at an angle of approximately 52 degrees from the vertical. However, other respective orientations of the two columns are also possible and contemplated herein. The microscope 100 includes a shutter capable of shrouding, e.g., protecting, the SEM column while the FIB column is used to process samples. The shutter may prevent sputtered material from redepositing on the SEM column components and/or prevent process gas flowing around the SEM column components from being activated due to secondary or back-scattered charged particles. Such activation can lead to deposition of contaminants on some of the components, which may affect their intended and desired operations.

SEM column 141, along with power supply and control unit 145, is provided with microscope 100. An electron beam 143 is emitted from a cathode 152 by applying voltage between cathode 152 and an anode 154. Electron beam 143 is focused to a fine spot by means of a condensing lens 156 and an objective lens 158. Electron beam 143 is scanned two-dimensionally on the specimen by means of a deflection coil 160. Operation of condensing lens 156, objective lens 158, and deflection coil 160 is controlled by power supply and control unit 145.

Electron beam 143 can be focused onto substrate 122, which is on movable X-Y stage 125 within lower chamber 126. When the electrons in the electron beam strike substrate 122, secondary electrons are emitted. These secondary electrons are detected by secondary electron detector 140. STEM detector 162, located beneath the TEM sample holder 124 and the stage 125, can collect electrons that are transmitted through the sample mounted on the TEM sample holder as discussed above.

Microscope 100 further includes FIB column 111 which comprises an evacuated chamber having an upper neck portion 112 within which are located an ion source 114 and a focusing column 116 including extractor electrodes and an electrostatic optical system. The upper neck portion 112 includes an ion source 114, an extraction electrode 115, a focusing element 117, deflection elements 120, and forms a focused ion beam 118. Focused ion beam 118 passes from ion source 114 through focusing column 116 and between electrostatic deflection means schematically indicated at 120 toward substrate 122, which comprises, for example, a sample positioned on movable X-Y stage 125 within lower chamber 126.

Stage 125 can preferably move in a horizontal plane (X and Y axes) and vertically (Z axis). Stage 125 can also tilt approximately sixty (60) degrees and rotate about the Z axis. In some embodiments, a separate TEM sample stage (not shown) can be used. Such a TEM sample stage will also preferably be moveable in the X, Y, and Z axes. A door 161 is opened for inserting substrate 122 onto X-Y stage 125 and also for servicing an internal gas supply reservoir, if one is used. The door is interlocked so that it cannot be opened if the system is under vacuum.

An ion pump 168 is employed for evacuating neck portion of the FIB and SEM columns 111 and 141, respectively. The chamber 126 is evacuated with turbomolecular and mechanical pumping system 130 under the control of vacuum controller 132. The vacuum system provides within chamber 126 a vacuum of between approximately $1 \times 10^{-7}$ Torr and $5 \times 10^{-4}$ Torr. If an etch assisting, an etch retarding gas, or a deposition precursor gas is used, the chamber background pressure may rise, typically to about $1 \times 10^{-5}$ Torr.

The high voltage power supply provides an appropriate acceleration voltage to electrodes in focusing column 116 for energizing and focusing ion beam 118. When it strikes substrate 122, material is sputtered, that is physically ejected, from the sample. Alternatively, ion beam 118 can decompose a precursor gas to deposit a material.

High voltage power supply 134 is connected to liquid metal ion source 114 as well as to appropriate electrodes in ion beam focusing column 116 for forming an approximately 1 keV to 60 keV ion beam 118 and directing the same toward a sample. Deflection controller and amplifier 136, operated in accordance with a prescribed pattern provided by pattern generator 138, is coupled to deflection plates 120 whereby ion beam 118 may be controlled manually or automatically to trace out a corresponding pattern on the upper surface of substrate 122. Beam blanking electrodes (not shown) within focusing column 116 cause ion beam 118 to impact onto blanking aperture (not shown) instead of substrate 122 when a blanking controller (not shown) applies a blanking voltage to the blanking electrode.

The liquid metal ion source 114 typically provides a metal ion beam of gallium. The source typically is capable of being focused into a sub one-tenth micrometer wide beam at substrate 122 for either modifying the substrate 122 by ion milling, enhanced etch, material deposition, or for the purpose of imaging the substrate 122. Alternatively, the liquid metal ion source 114 may be replaced by a plasma-based ion source, which is capable of providing a variety of ion species for processing a sample.

A charged particle detector 140, such as an Everhart Thornley or multi-channel plate, used for detecting secondary ion or electron emission is connected to a video circuit 142 that supplies drive signals to video monitor 144 and receiving deflection signals from a system controller 119. The location of charged particle detector 140 within lower chamber 126 can vary in different embodiments. For example, a charged particle detector 140 can be coaxial with the ion beam and include a hole for allowing the ion beam to pass. In other embodiments, secondary particles can be collected through a final lens of SEM column 141 and then diverted off axis for collection.

A micromanipulator 147 can precisely move objects within the vacuum chamber. Micromanipulator 147 may comprise precision electric motors 148 positioned outside the vacuum chamber to provide X, Y, Z, and theta control of a portion 149 positioned within the vacuum chamber. The micromanipulator 147 can be fitted with different end effectors for manipulating small objects. In the embodiments, the end effector is a thin probe 150.

A gas delivery system 146 extends into lower chamber 126 for introducing and directing a variety of gaseous vapor toward substrate 122. For example, iodine can be delivered to enhance etching, or a metal organic compound can be delivered to deposit a metal. Gas delivery system 146, which may also be called gas injection system (GIS) 146, includes a nozzle 172 and is coupled to motion control motors 170. Motion control motors 170 may be controlled to move GIS 146 into and out of a position proximate SEM and FIB columns and stage 125 during sample processing with the FIB column 111 so that components of the SEM column are protected. The shutter 174 may be coupled to or integrally formed with the nozzle 172 end of GIS 146. The shutter 174 may be formed from a conductive material so that charge build up does not occur when in an insertion position. In some examples, a shutter 174 is coupled to nozzle 172 so that when the nozzle is moved into position close to the stage 125 to provide a gas to the sample, the shutter shrouds or provides a protective barrier to the SEM column 141 during sample processing.

System controller 119 controls the operations of the various parts of microscope 100. Through system controller 119, a user can cause ion beam 118 or electron beam 143 to be scanned in a desired manner through commands entered into a conventional user interface (not shown). Alternatively, system controller 119 may microscope 100 in accordance with programmed instructions stored in a memory 121. In some examples, microscope 100 incorporates image recognition software to automatically identify regions of interest, and then the system can manually or automatically extract samples in accordance with the invention. For example, the system could automatically locate similar features on semiconductor wafers including multiple devices, and take samples of those features on different (or the same) devices.

In some examples, system controller 119 includes or is coupled to code that when executed by the system controller 119 causes the motors 170 to move the GIS 146, and by extension the shutter 174, between an insertion or processing position and a retraction position. For example, the insertion or processing position may cause the shutter 174 to be arranged between the end of the SEM column 141 and the stage 125. In such a position, the shutter 174 may provide a protective cover to the SEM column 141, and its components, from redeposition of sputtered material or interaction of errant charged particles interacting with processing gases during sample processing by FIB 111. When a sample is not being processed, the controller 119 can cause the GIS 146 and shutter 174 to be retracted from the processing position to a retracted position out of the way of SEM column 141.

Figure 2:
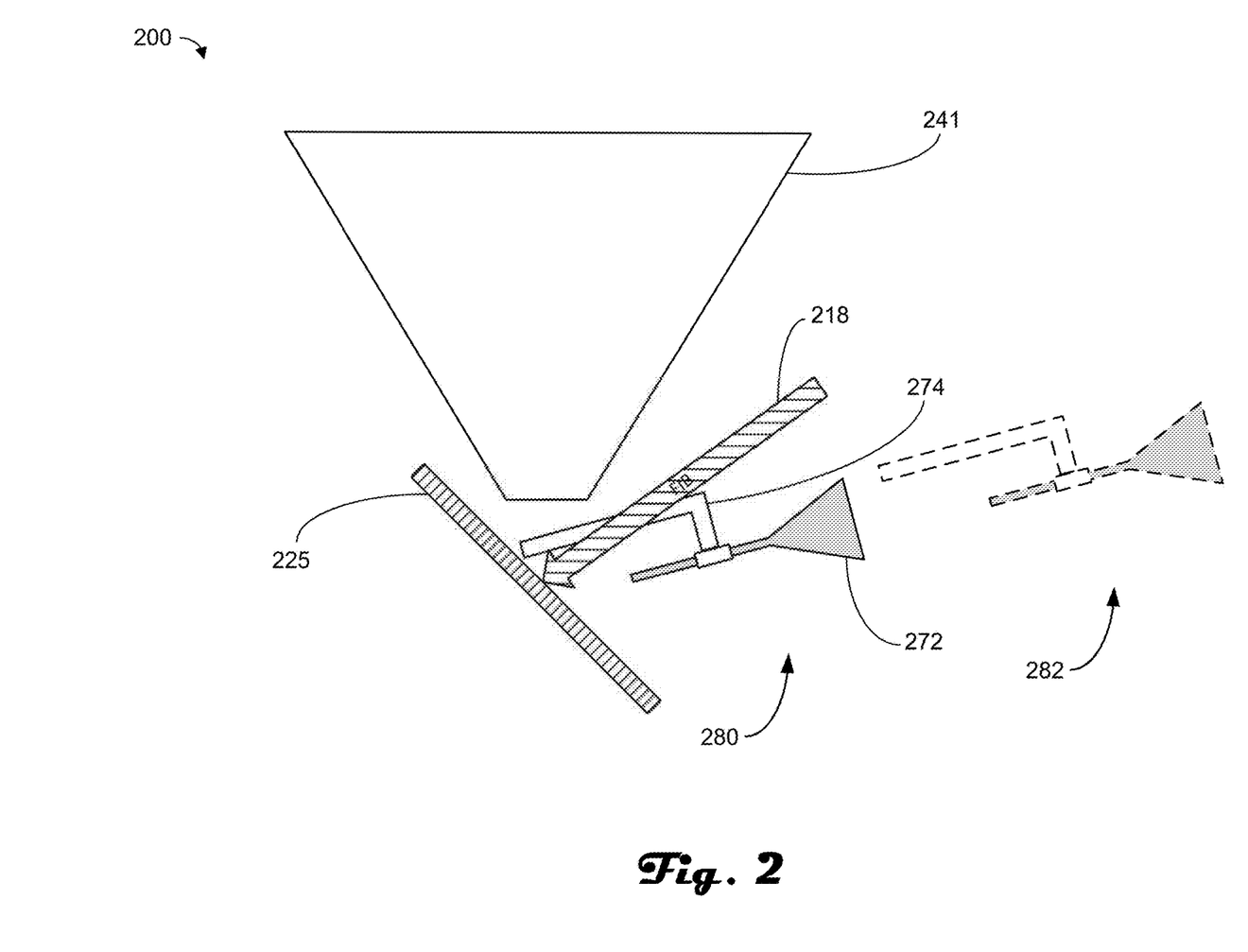
FIG. 2 is an illustration of a system for providing protection for a charged particle column with a shutter in accordance with an embodiment of the present disclosure.

FIG. 2 is an illustration of a system 200 for providing protection for a charged particle column with a shutter in accordance with an embodiment of the present disclosure. System 200 could be included in microscope 100, for example, or any charged particle microscope system that includes charged particle based sample processing, such as sputter, etching and deposition. In some examples, the system 200 can be used to protect SEM column components from contamination and degradation due to processing samples with ion beams, such as focused ion beams. In other examples, system 200 can be used to protect transmission electron microscope (TEM) components from contamination and degradation due to processing samples with an ion beam.

System 200 includes a charged particle column 241 (or a portion thereof), a stage 225, a GIS nozzle 272 (or simply nozzle 272), and a shutter 274. In some examples, the portion of the charged particle column 241 may be a pole piece of an SEM column. In other examples, the portion of the charged particle column 241 may be an electron-optics lens, such as an objective lens, of a TEM.

Stage 225 may support a sample (not shown) for ion-based processing and imaging with charged particle column 241. Similar to stage 125, stage 225 may be coupled to components that can move the stage in multiple directions, such as translations in 3 directions and rotation about one or more axes.

A focused ion beam 218 may be directed toward a sample on stage 225 by a FIB column (not shown), such as FIB column 118 for example. To simplify the figure, only the direction of the FIB 218 to the stage 225 is shown.

Shutter 274 is coupled to or incorporated into an end of GIS nozzle 272 so that when the GIS nozzle 272 is in the insertion position 280, the shutter 274 is arranged in between the stage 225 and the charged particle column 241. While the GIS nozzle 272 is in the insertion or processing position 280, shutter 274 can protect the charged particle column 241 while sample processing by the FIB 218. For example, FIB 218 approaches the stage 218 from an angle with respect to the charged particle column 241, and travels under the shutter 274 to interact with a sample on stage 225. The interaction may occur in an area under the shutter 274 and any processing debris generated, such as sputtered material, may be blocked from reaching the portion of the charged particle column 241 to redeposit on or in the column 241. Additionally, if the GIS nozzle 272 is providing a process gas, for etch or deposition, then the shutter 274 may prevent any secondary or backscattered charged particles from reaching the column 241 to interact with any process gas that may be present.

In some examples, a sputter target (not shown) may be formed or coupled to shutter 274 that can be used to deposit material onto a sample. For example, a solid source sputter target of gold, for example, may be formed on the shutter 274 in a location proximate to where the FIB 218 is close to the shutter 274. Then, to deposit gold from the sputter target, the FIB 218 may be directed toward the sputter target to dislodge material that may then deposit on a sample on stage 225.

When imaging needs to be performed by the charged particle column 241, the GIS nozzle 272 may be retracted to the retraction location 282 so that the shutter 274 is out of the way of any charged particle beam provided by the column 241. The movement of the GIS nozzle 272 may be performed by one or more motors (not shown) such as motors 170 of FIG. 1. In some examples, the movement of GIS nozzle 272 may be a simple back and forth movement between locations 280 and 282. In other examples, the movement of GIS nozzle 272 may include translation and rotation around at least one axis so that the shutter 274 can be aligned to an optical axis of the charged particle column 241. In some examples, shutter 274 includes alignment marks on a side facing charged particle column 241, where the alignment marks can be imaged to assist with aligning the shutter 274 with the optical axis of the charged particle column 241.

FIGS. 3A through 3D show example shutters 374 and an illustration of alignment marks 376, respectively, in accordance with an embodiment of the present disclosure. Each of the example shutters 374A through 374C can be used in system 100, 200 or 400, for example.

Figure 3A:
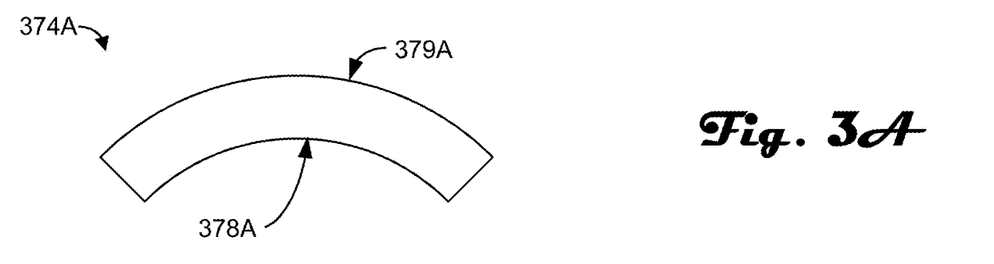
FIGS. 3A through 3D show example shutters and an illustration of alignment marks, respectively, in accordance with an embodiment of the present disclosure.
Figure 3B:
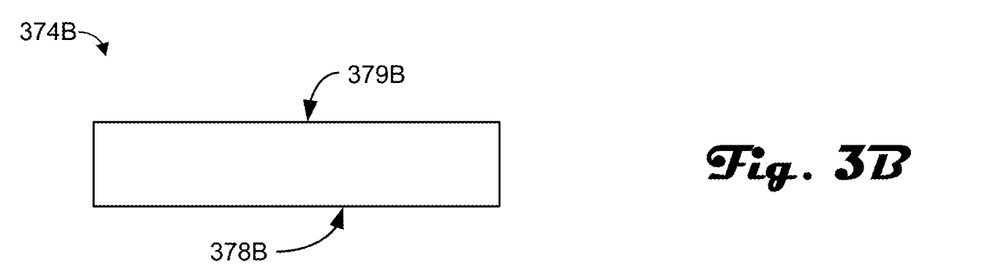

FIG. 3A is a cross-section of an example shutter 374A in accordance with an embodiment of the present disclosure. Shutter 374A has a crescent-like shape with the concave side 378A facing a stage/sample area and the convex side 379A facing a charged particle column component. The side 379A would also be the side/surface where alignment marks are located. FIG. 3B is similar to 374A except that the cross-section shape is flat instead of crescent-like.

Figure 3C:
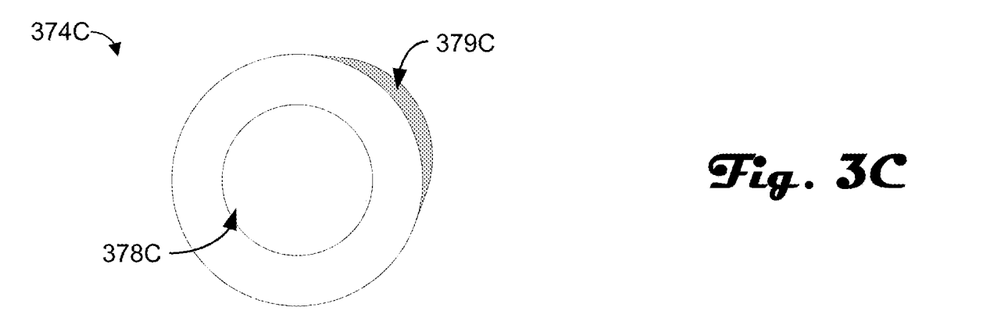

FIG. 3C is a cross-section of an example shutter 374C in accordance with an embodiment of the present disclosure. Shutter 374C is cylindrical shape with internal surface 378C and external surface 379C. Shutter 374C may be arranged so that a working area of a sample is within the shutter 374C. While not shown, shutter 374C may have a hole, slit or indention cut out of one side to accommodate an ion beam for sample interaction.

Figure 3D:
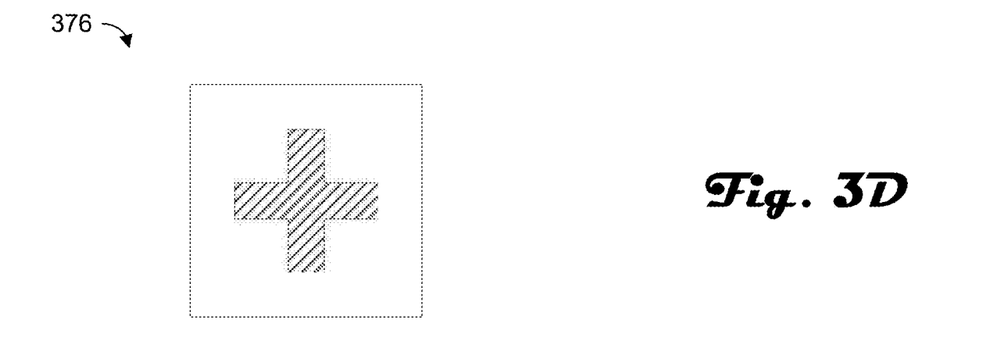

FIG. 3D shows example alignment marks 376 in accordance with an embodiment of the present disclosure. Alignment marks 376 can be any pattern or structure formed on or in a shutter that can be imaged by a charged particle beam. The plus sign alignment mark shown should not be considered limiting in any way.

Figure 4:
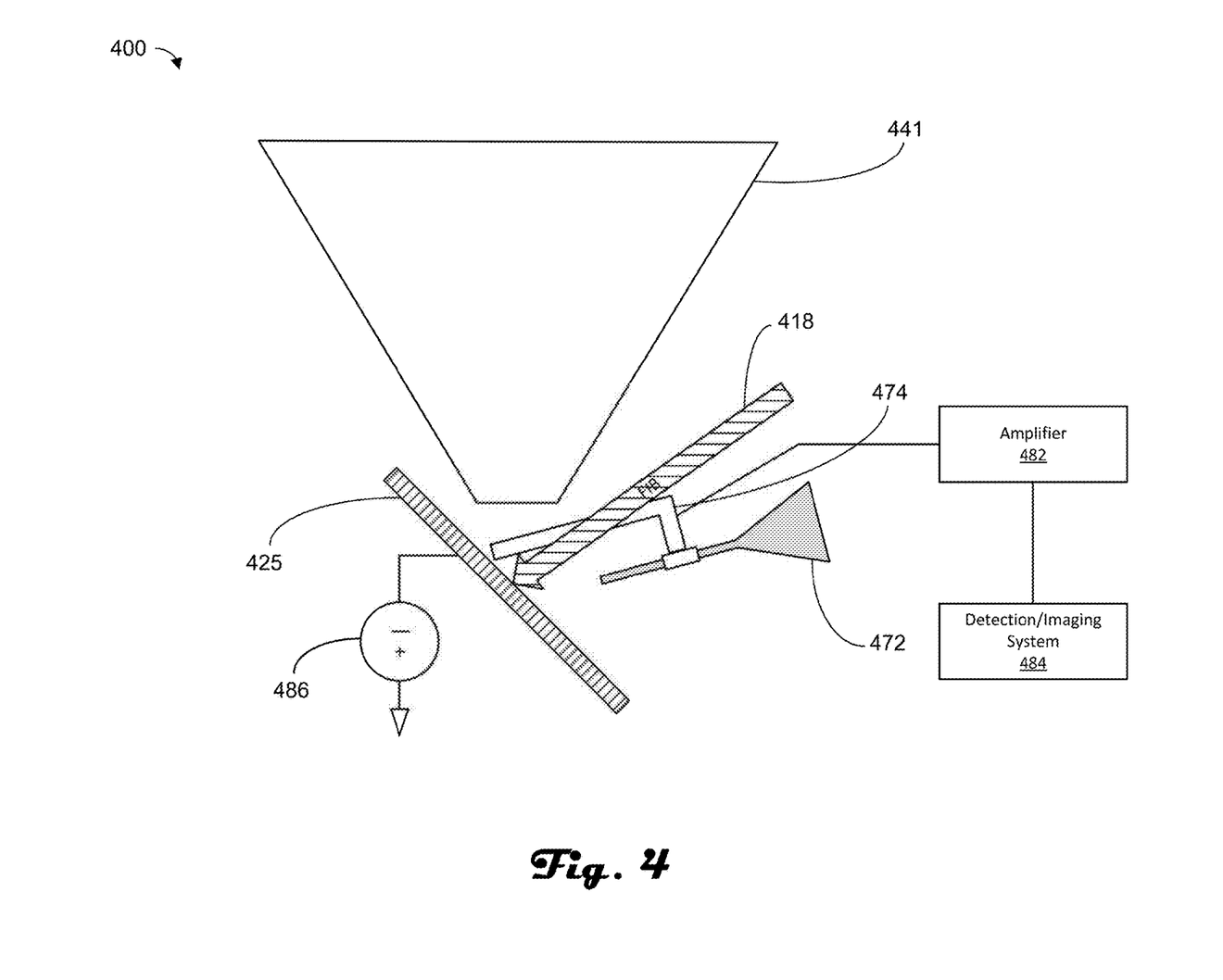
FIG. 4 is an example system in accordance with an embodiment of the present disclosure.

FIG. 4 is an example system 400 in accordance with an embodiment of the present disclosure. Example system 400 shows a portion of a charged particle microscope, such as microscope 100, that includes a shutter for protecting charged particle column components. Many of the features of system 400 are the same as shown in system 200 and will not be discussed again for sake of brevity. The additional features of system 400 includes a voltage source 486, an amplifier 482, and a detection/imaging system 484. The combination of these features allows the shutter to provide imaging capabilities in addition to the charged particle column protective aspects.

Amplifier 482 may be electrically coupled to shutter 474, via a conductive lead for example, and be configured to amplify current signals received from shutter 474. Detection and imaging system 484 may convert current signals received from amplifier 482 into images for display to a user or recording. Since the shutter 474 may be blocking charged particle column 441, which may include detectors used for imaging, detection and imaging system 484 may provide a detection scheme when the shutter 474 is in the insertion position. Voltage source 486 may be coupled to stage 425, and be configured to bias the stage with either a positive or negative voltage.

In operation, the additional components of system 400 allows for imaging a sample during FIB processing and while the shutter 474 is in the insertion location. For example, with the stage 425 biased by voltage source 486, any secondary electrons generated during sample processing by FIB 418 may be directed away from the stage 425 and toward shutter 474. The secondary electrons may then be collected by shutter 474 where a current will be generated. The generated current may then be amplified by amplifier 482 and provided to detection and imaging system 484. Detection and imaging system 484 may then form an image of the sample based thereon.

Figure 5:
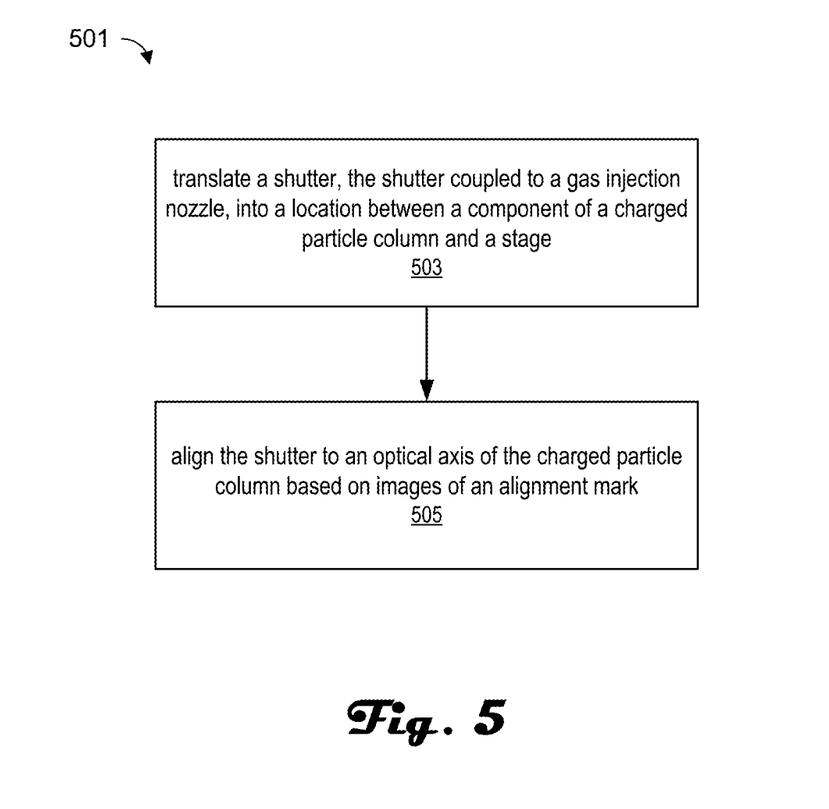
FIG. 5 is an example method in accordance with an embodiment of the present disclosure.

FIG. 5 is an example method 501 in accordance with an embodiment of the present disclosure. The method 501 may be performed by a charged particle microscope that includes a shutter attached to a retractable GIS system. For example, method 501 may be performed by microscope 100. The example method 501 may be used to position a shutter in a processing/insertion location during FIB processing of a sample, and to retract the shutter when not needed. By positioning the shutter in the processing location during FIB processing, charged particle column components can be protected, e.g., shrouded, by the shutter so that unwanted deposition or redeposition of material is reduced or prevented.

Method 501 begin at process block 503, which includes translating a shutter, the shutter coupled to a gas injection nozzle, into a location between a charged particle column and a stage. The gas injection nozzle may be part of a GIS system that includes motors coupled to move the nozzle into position. The motors may further be able to move the nozzle in other direction and rotations so that the shutter may be aligned to an optical axis of the charged particle column.

Process block 503 may be followed by process block 505, which includes aligning the shutter to the optical axis of the charged particle column. The alignment may be based on images acquired by the charged particle column of an alignment mark formed on the shutter. The alignment mark is formed on a side of the shutter facing the charged particle column. Alignment of the shutter with the charged particle column includes both linear alignment in orthogonal X, Y and Z directions as well as rotation around an axis of the GIS system. Once the shutter is inserted and aligned, FIB processing of a sample may proceed while sensitive components of the charged particle column are protected from degradation.

Figure 6:
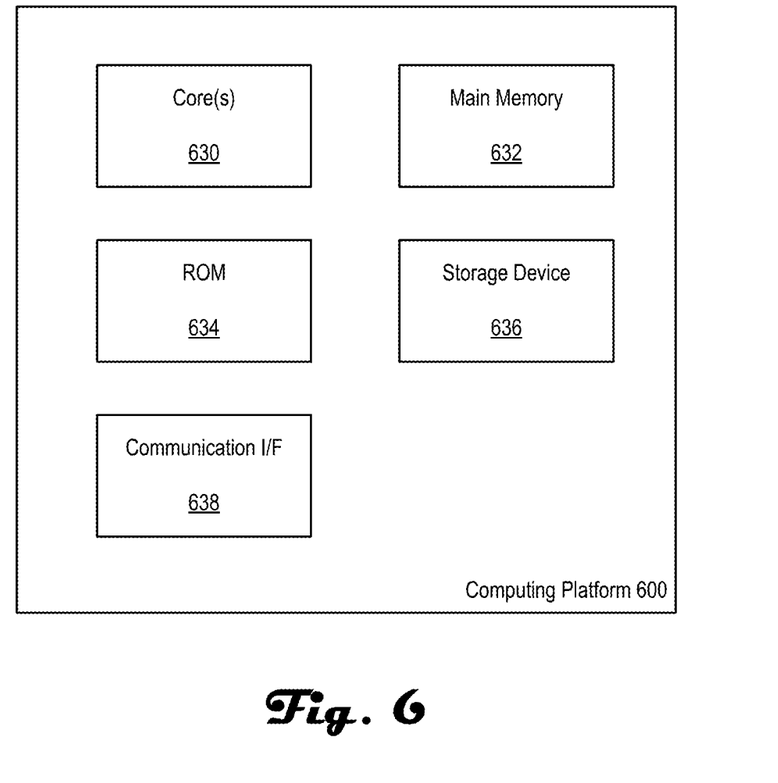
FIG. 6 is an example functional block diagram in accordance with an embodiment of the present disclosure.

FIG. 6 is an example functional block diagram 600 in accordance with an embodiment of the present disclosure. FIG. 6 is a block diagram that illustrates a computer system 600 that an example microscope implementing the disclosed techniques may include. The computing system 600 may be an example of computing hardware included with microscopes 100, 200, or 400 such controller 119. Computer system 600 at least includes a hardware processor, e.g., core, 630, main memory 632, RIM 634, storage device 636, and communication interface 638. Hardware processor 642 may be, for example, a general purpose microprocessor. The computing system 600 may be used to implement the methods and techniques disclosed herein, such as method 501.

Main memory 632, which may be random access memory (RAM) or other dynamic storage device, is coupled to store information and instructions to be executed by processor 630. Main memory 632 also may be used for storing temporary variables or other intermediate information during execution of instructions to be executed by processor 630. Such instructions, when stored in non-transitory storage media accessible to processor 630, render computer system 600 into a special-purpose machine that is customized to perform the operations specified in the instructions.

Read only memory (ROM) 634 or other static storage device coupled to store static information and instructions for processor 630. A storage device 636, such as a magnetic disk or optical disk, is provided and coupled to store information and instructions.

Computer system 600 may implement the techniques described herein using customized hard-wired logic, one or more ASICs or FPGAs, firmware and/or program logic which in combination with the computer system causes or programs computer system 600 to be a special-purpose machine. According to one embodiment, the techniques herein are performed by computer system 600 in response to processor 630 executing one or more sequences of one or more instructions contained in main memory 632. Such instructions may be read into main memory 632 from another storage medium, such as storage device 636. Execution of the sequences of instructions contained in main memory 632 causes processor 30 to perform the process steps described herein. In alternative embodiments, hard-wired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical or magnetic disks, such as storage device 636. Volatile media includes dynamic memory, such as main memory 632. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, content-addressable memory (CAM), and ternary content-addressable memory (TCAM).

Storage media is distinct from but may be used in conjunction with transmission media. Transmission media participates in transferring information between storage media. For example, transmission media includes coaxial cables, copper wire and fiber optics, including wires that couple the components of computer system 600 to one another. Transmission media can also take the form of acoustic or light waves, such as those generated during radio-wave and infra-red data communications.

Computer system 600 also includes a communication interface 638. Communication interface 638 provides a two-way data communication coupling to a network and/or other components of a microscope. For example, communication interface 638 may be an integrated services digital network (ISDN) card, cable modem, satellite modem, or a modem to provide a data communication connection to a corresponding type of communication line. As another example, communication interface 638 may be a local area network (LAN) card to provide a data communication connection to a compatible LAN. Wireless links may also be implemented. In any such implementation, communication interface 656 sends and receives electrical, electromagnetic or optical signals that carry digital data streams representing various types of information.

The embodiments discussed herein to illustrate the disclosed techniques should not be considered limiting and only provide examples of implementation. For example, the shutter can be formed in any shape capable of shrouding various components of a charged particle column. Those skilled in the art will understand the other myriad ways of how the disclosed techniques may be implemented, which are contemplated herein and are within the bounds of the disclosure.

What is claimed is:

1. An apparatus comprising:
an SEM column and a focused ion beam (FIB) column;
a gas injection nozzle coupled to a translation device, the translation device configured to insert the gas injection nozzle into a processing position; and
a shutter coupled to the gas injection nozzle and arranged to be disposed between a sample and the SEM column when the gas injection nozzle is inserted into the processing position, wherein the shutter is arranged to protect components of the SEM column during sample processing with the FIB column.

2. The apparatus of claim 1, wherein the shutter includes one or more alignment marks disposed on a side facing the SEM column.

3. The apparatus of claim 2, wherein the SEM column acquires one or more images to align the shutter with an optical axis of the SEM column so that the shutter shrouds the SEM column.

4. The apparatus of claim 1, wherein the shutter is arranged so that a focused ion beam provided by the FIB column is unobstructed by the shutter when directed toward the stage.

5. The apparatus of claim 1, further including:
a voltage source coupled to the stage;
a current amplifier coupled to the shutter; and
an imaging system coupled to the amplifier.

6. The apparatus of claim 5, wherein the shutter is crescent shaped with a concave side facing the stage.

7. The apparatus of claim 1, wherein the shutter includes a sputter target.

8. An apparatus comprising:
a charged particle column;
a stage arranged proximate the charged particle column, the stage configured to support a sample;
a gas injection system including a nozzle at a distal end, the gas injection system coupled to a movement device, the gas injection system further coupled to a gas source for delivery of a gas to the sample;
a shutter coupled to the distal end of the gas injection system; and
a controller coupled to at least control the movement device, the controller coupled to or including computer instructions that, when executed by the controller, cause the controller to:
insert the gas injection system to a process location so that gas is delivered to a surface of the sample, wherein the shutter is inserted to a location between the stage and a component of the charged particle column, wherein the shutter is arranged to protect components of the SEM column during sample processing with the FIB column.

9. The apparatus of claim 8, wherein the shutter includes alignment marks disposed on a side facing a pole piece of the charged particle column.

10. The apparatus of claim 8, wherein the shutter includes a sputter target.

11. The apparatus of claim 8, further including a focused ion beam column arranged to direct a focused ion beam toward the sample when the shutter is inserted.

12. The apparatus of claim 8, wherein the shutter is crescent shaped with a concave side facing the stage.

* * * * *